United States Patent
Hashimoto

(10) Patent No.: US 11,121,525 B2
(45) Date of Patent: Sep. 14, 2021

(54) QUANTUM CASCADE LASER

(71) Applicant: SUMITOMO ELECTRIC INDUSTRIES, LTD., Osaka (JP)

(72) Inventor: Jun-ichi Hashimoto, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 61 days.

(21) Appl. No.: 16/584,973

(22) Filed: Sep. 27, 2019

(65) Prior Publication Data
US 2020/0112143 A1 Apr. 9, 2020

(30) Foreign Application Priority Data
Oct. 5, 2018 (JP) .............................. JP2018-190154

(51) Int. Cl.
| H01S 5/34 | (2006.01) |
|---|---|
| H01S 5/227 | (2006.01) |
| H01S 5/028 | (2006.01) |
| H01S 5/042 | (2006.01) |
| H01S 5/10 | (2021.01) |
| H01S 5/12 | (2021.01) |
| H01S 5/024 | (2006.01) |
| H01S 5/02 | (2006.01) |

(52) U.S. Cl.
CPC ............ H01S 5/3402 (2013.01); H01S 5/028 (2013.01); H01S 5/0287 (2013.01); H01S 5/0425 (2013.01); H01S 5/1082 (2013.01); H01S 5/227 (2013.01); H01S 5/0207 (2013.01); H01S 5/02461 (2013.01); H01S 5/12 (2013.01)

(58) Field of Classification Search
CPC .... H01S 5/3401; H01S 5/3402; H01S 5/0207; H01S 5/0287
See application file for complete search history.

(56) References Cited

U.S. PATENT DOCUMENTS

| 2013/0322480 | A1* | 12/2013 | Edamura | B82Y 20/00 372/45.01 |
|---|---|---|---|---|
| 2015/0117484 | A1* | 4/2015 | Sugiyama | H01S 5/0281 372/45.01 |
| 2015/0318668 | A1* | 11/2015 | Yoshinaga | H01S 5/0287 372/45.012 |
| 2017/0040769 | A1* | 2/2017 | Hashimoto | H01S 5/0287 |

OTHER PUBLICATIONS

S.R. Darvish et al., "High-Power, Continuous-Wave Operation of Distributed-Feedback Quantum-Cascade Lasers At λ~7.8 μm," Applied Physics Letters, vol. 89, 211119, 2006, 4 pgs.

* cited by examiner

Primary Examiner — Tod T Van Roy
(74) Attorney, Agent, or Firm — Volpe Koenig

(57) ABSTRACT

A quantum cascade laser including: a laser structure having a first region including a first facet, a second region including a second facet, an epitaxial surface, and a substrate surface; an insulating film disposed on the second facet and the epitaxial surface; an electrode disposed on the epitaxial surface and the insulating film and in contact with the epitaxial surface; and a metal film disposed over the second facet and the epitaxial surface and separated from the electrode and the substrate surface. The insulating film is disposed between the metal film and the second facet and between the metal film and the epitaxial surface. The second region includes a semiconductor mesa. The second facet is located at a boundary between the first region and the second region. The first region includes a connecting surface. The connecting surface connects the second facet to the first facet.

8 Claims, 10 Drawing Sheets

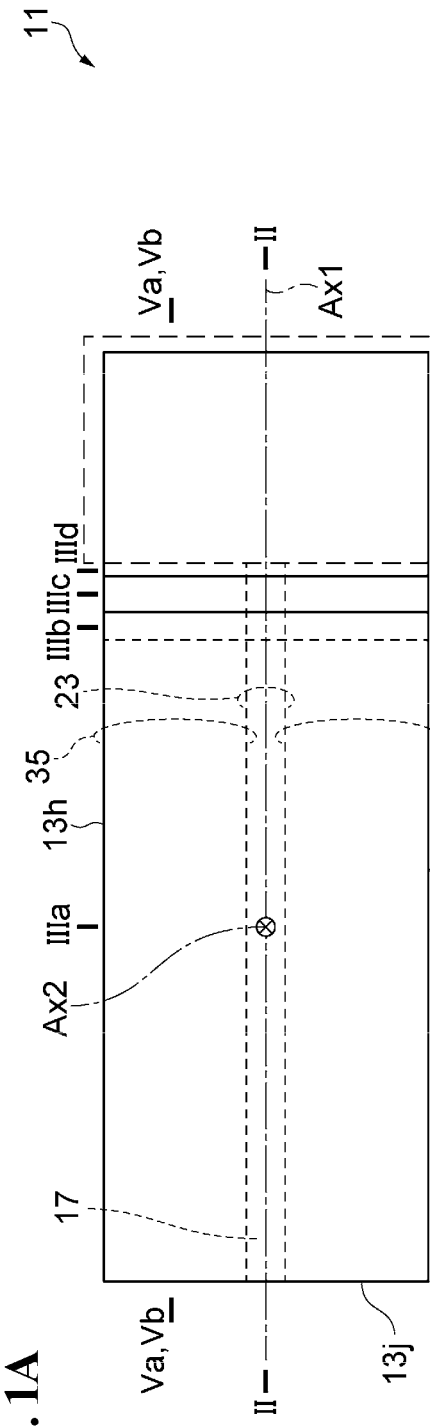
FIG.1A
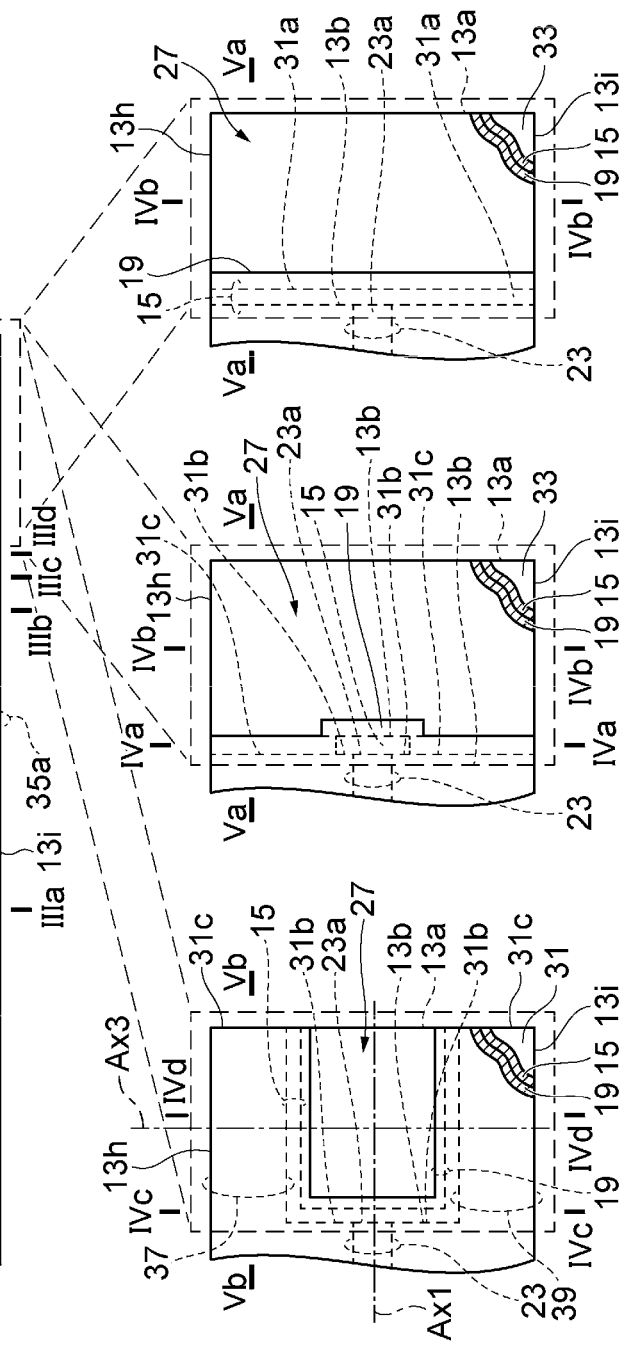
FIG.1B
FIG.1C
FIG.1D

QUANTUM CASCADE LASER

BACKGROUND OF THE INVENTION

1. Field of the Invention

The present invention relates to quantum cascade lasers.

2. Description of the Related Art

Applied Physics Letters, vol. 89, 251119, 2006 discloses a quantum cascade laser capable of emitting mid-infrared light.

A quantum cascade laser includes an emitting facet and a reflecting facet and has a reflective film on the reflecting facet to achieve high reflectivity. The reflective film is produced as follows. A laser bar is produced from a finished substrate product having anode and cathode electrodes formed thereon. The laser bar includes a one-dimensional array of segments for semiconductor lasers and has facets for emitting and reflecting facets. A reflective film is formed by supplying a flux containing the constituent atoms of the reflective film to one facet of the laser bar. Specifically, a metal film is formed on the reflecting facet of a quantum cascade laser to achieve a higher reflectivity.

In the process of forming the reflective film by deposition on the facet of the laser bar, any flux missing the facet of the laser bar forms a deposit on the upper and lower surfaces of the laser bar. This method of production makes it difficult to control the thickness of the deposit on the upper and lower surfaces of the laser bar. What is needed for quantum cascade lasers is to eliminate the difficulty in controlling the deposit thickness.

SUMMARY OF THE INVENTION

An object of one aspect of the present invention is to provide a quantum cascade laser having a structure that can avoid forming a reflective metal film by deposition on a laser bar while allowing the metal film to be disposed over the reflecting facet.

A quantum cascade laser according to one aspect of the present invention includes a laser structure having a first region including a first facet, a second region including a second facet, an epitaxial surface, and a substrate surface; an insulating film disposed on the second facet and the epitaxial surface of the laser structure; an electrode disposed on the epitaxial surface of the laser structure and the insulating film and in contact with the epitaxial surface through an opening in the insulating film; and a metal film disposed over the second facet and the epitaxial surface of the laser structure and separated from the electrode and the substrate surface. The insulating film is disposed between the metal film and the second facet and between the metal film and the epitaxial surface. The epitaxial surface is opposite the substrate surface. The first region and the second region are arranged in a direction of a first axis. The second region includes a semiconductor mesa having a core layer extending in the direction of the first axis. The second facet is located at a boundary between the first region and the second region. The second facet terminates the semiconductor mesa. The first region includes a connecting surface extending in the direction of the first axis. The connecting surface connects the second facet to the first facet.

The above and other objects, features, and advantages of the present invention will become more readily apparent from the following detailed description of preferred embodiments of the present invention taken in conjunction with the accompanying drawings.

BRIEF DESCRIPTION OF THE DRAWINGS

FIGS. 1A to 1D are schematic plan views of a quantum cascade laser according to one embodiment.

DESCRIPTION OF THE PREFERRED EMBODIMENTS

Figures 2A, 2B, 2C, 2D:
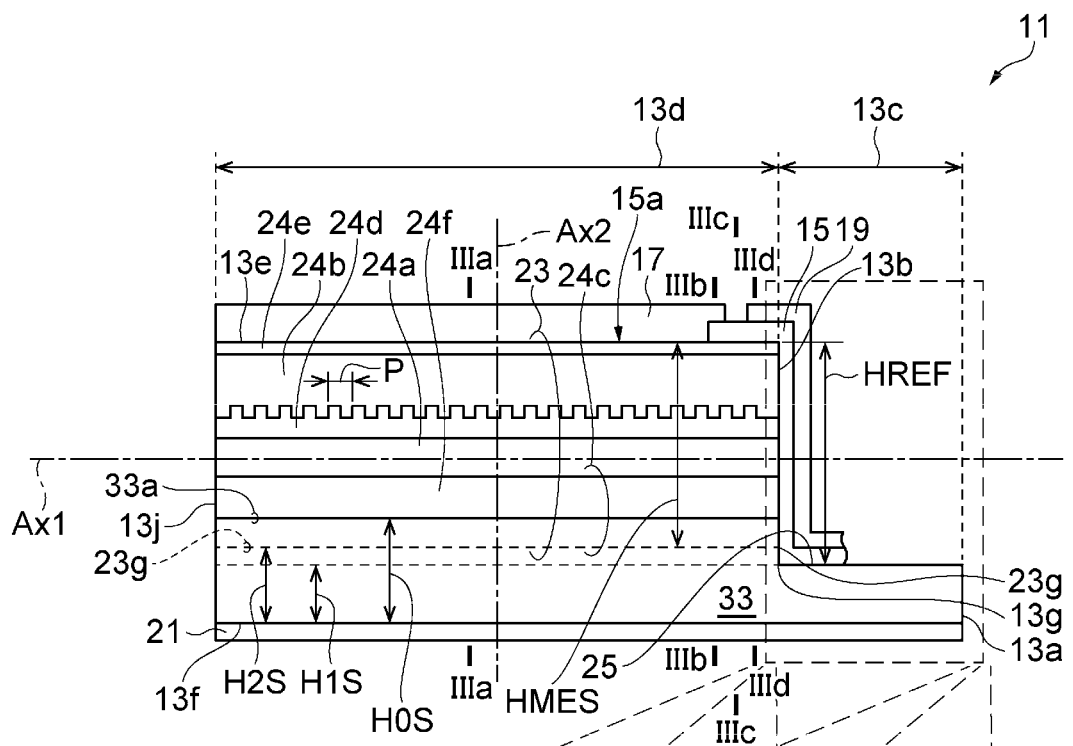
FIGS. 2A to 2D are sectional views taken along line II-II in FIG. 1A.

Some specific examples will now be described.
A specific example of a quantum cascade laser includes (a) a laser structure having a first region including a first facet, a second region including a second facet, an epitaxial surface, and a substrate surface; (b) an insulating film disposed on the second facet and the epitaxial surface of the laser structure; (c) an electrode disposed on the epitaxial surface of the laser structure and the insulating film and in contact with the epitaxial surface through an opening in the insulating film; and (d) a metal film disposed over the second facet and the epitaxial surface of the laser structure and separated from the electrode and the substrate surface. The insulating film is disposed between the metal film and the second facet and between the metal film and the epitaxial surface. The epitaxial surface is opposite the substrate surface. The first region and the second region are arranged in a direction of a first axis. The second region includes a semiconductor mesa having a core layer extending in the direction of the first axis. The second facet is located at a boundary between the first region and the second region. The second facet terminates the semiconductor mesa. The first region includes a connecting surface extending in the direction of the first axis. The connecting surface connects the second facet to the first facet.

In the quantum cascade laser, the connecting surface is provided so as to connect the second facet to the first facet and isolates the second facet from the first facet in the direction of the first axis. By this isolation, the metal film can be disposed over the second facet without being disposed over the first facet and can thus provide high reflectivity at the end of the semiconductor mesa.

In addition, the second facet is located at the boundary between the first region and the second region and joins the epitaxial surface to the connecting surface. The second facet and the connecting surface form a recess. This recess allows the first facet and the second facet to be disposed away from each other and also allows the semiconductor mesa to terminate at a position away from the first facet.

In the quantum cascade laser, the second facet, which terminates the semiconductor mesa, is made highly reflective by the formation of the metal film over the second facet, and can also provide a propagation path for heat dissipation from the semiconductor mesa through the metal film.

In a specific example of a quantum cascade laser, the laser structure includes an embedding body and a substrate. The second facet has a bottom thereof within the substrate. The substrate has the embedding body disposed thereon. The embedding body has, in the second region, a current-blocking portion having the semiconductor mesa embedded therein.

In the quantum cascade laser, the second facet, which has the bottom thereof within the substrate, and the embedding body facilitate formation of the metal film over the mesa facet of the semiconductor mesa. In addition, the current-blocking portion is provided in the embedding body so that the current-blocking portion facilitates heat dissipation from the semiconductor mesa in the second region.

In a specific example of a quantum cascade laser, the connecting surface extends from one side surface to another side surface of the laser structure. The insulating film and the metal film are disposed over the connecting surface.

The quantum cascade laser allows the second facet to extend from one side surface to another side surface of the laser structure. The mesa facet of the semiconductor mesa and its surrounding area can be provided in the second facet, and the metal film and the insulating film are disposed over the connecting surface and the mesa facet and its surrounding area. The metal film can provide a heat propagation path from the facet of the semiconductor mesa through the connecting surface to the substrate.

In a specific example of a quantum cascade laser, the laser structure has, in the first region, a first extending portion and a second extending portion extending from the current-blocking portion of the embedding body. The metal film is disposed over the first extending portion and the second extending portion.

In the quantum cascade laser, the first extending portion and the second extending portion extend from the current-blocking portion, and the insulating film and the metal film are continuously disposed over the second facet, the connecting surface, the first extending portion, and the second extending portion. In addition, the first extending portion and the second extending portion can provide a heat propagation path from the side surfaces of the semiconductor mesa through the current-blocking portion to the substrate.

In a specific example of a quantum cascade laser, the first extending portion and the second extending portion have a first side surface and a second side surface, respectively, extending in the direction of the first axis. The first side surface and the second side surface are connected to the first facet. The connecting surface connects the first side surface and the second side surface to each other. The second facet connects the first side surface and the second side surface to each other. The insulating film and the metal film are disposed over the connecting surface, the first side surface, and the second side surface.

In the quantum cascade laser, the connecting surface, the first side surface, and the second side surface connect the first facet to the second facet and separate the first facet from the second facet. The metal film can provide a heat propagation path from the mesa facet of the semiconductor mesa through the connecting surface to the substrate.

In a specific example of a quantum cascade laser, the insulating film is disposed on the connecting surface. The insulating film is separated from an upper end of the first facet. The metal film is disposed over the connecting surface. The metal film is separated from the upper end of the first facet. The first facet connects the substrate surface to the connecting surface.

In the quantum cascade laser, the metal film and the insulating film are not directly subjected to force applied to the product during the production of the semiconductor chip of the quantum cascade laser.

In a specific example of a quantum cascade laser, the insulating film is disposed on the connecting surface. The insulating film reaches an upper end of the first facet. The metal film is disposed over the connecting surface. The first facet connects the substrate surface to the connecting surface.

The quantum cascade laser allows the insulating film to cover the semiconductor.

In a specific example of a quantum cascade laser, the metal film does not reach the upper end of the first facet.

In the quantum cascade laser, the metal film is not directly subjected to force applied to the product during the production of the semiconductor chip of the quantum cascade laser.

The findings of the present invention can be easily understood from the following detailed description with reference to the accompanying drawings, which are given by way of example. Next, a quantum cascade laser and a method for producing the quantum cascade laser according to one embodiment will now be described with reference to the accompanying drawings. Where possible, like parts are denoted by like reference numerals.

FIG. 1A is schematic plan view of a quantum cascade laser according to this embodiment. FIG. 2A is sectional view taken along line in FIG. 1A. A quantum cascade laser 11 includes a laser structure 13, an insulating film 15, a first electrode 17, and a metal film 19. The laser structure 13 has a first facet 13a and a second facet 13b. The laser structure 13 includes a first region 13c including the first facet 13a and a second region 13d including the second facet 13b. The first region 13c and the second region 13d are arranged in the direction of a first axis Ax1. The laser structure 13 has an epitaxial surface 13e and a substrate surface 13f. The epitaxial surface 13e is a top surface of a stacked semiconductor layers epitaxially grown on a substrate 33. The substrate surface 13f is a back surface of the substrate 33. The epitaxial surface 13e is opposite the substrate surface 13f.

The insulating film 15 is disposed on the second facet 13b of the laser structure 13 and the epitaxial surface 13e. The insulating film 15 is disposed between the metal film 19 and the second facet 13b and between the metal film 19 and the epitaxial surface 13e. The first electrode 17 is disposed on the epitaxial surface 13e of the laser structure 13 and the insulating film 15 and in contact with the epitaxial surface 13e through a contact opening 15a in the insulating film 15. The metal film 19 is disposed over the laser structure 13, specifically, over the second facet 13b and the epitaxial surface 13e, and is separated from the first electrode 17 and the substrate surface 13f. The insulating film 15 isolates the laser structure 13 from the metal film 19.

The second facet 13b is located at the boundary between the first region 13c and the second region 13d. The first region 13c includes a connecting surface 25 extending in the direction of the first axis Ax1. In this example, the connecting surface 25 connects the second facet 13b to the first facet 13a.

The laser structure 13, specifically, the second region 13d, includes a semiconductor mesa 23. The second facet 13b terminates the semiconductor mesa 23 and forms a mesa facet 23a. The semiconductor mesa 23 has a core layer 24a extending in the direction of the first axis Ax1.

In the quantum cascade laser 11, the connecting surface 25 is provided so as to connect the second facet 13b to the first facet 13a and isolates the second facet 13b from the first facet 13a in the direction of the first axis Ax1. By this isolation, the metal film 19 can be disposed over the second facet 13b without being disposed over the first facet 13a and can thus provide high reflectivity at the end of the semiconductor mesa 23.

The second facet 13b, which terminates the semiconductor mesa 23, can provide a propagation path for heat from the semiconductor mesa 23 through the metal film 19.

The second facet 13b is located at the boundary between the first region 13c and the second region 13d and joins the epitaxial surface 13e to the connecting surface 25. The second facet 13b and the connecting surface 25 form a recess 27. This recess 27 allows the first facet 13a and the second facet 13b to be disposed away from each other and also allows the semiconductor mesa 23 to terminate at a position away from the first facet 13a.

As shown in FIGS. 1A and 2A, the laser structure 13 includes a third facet 13j. The third facet 13j is opposite the first facet 13a and the second facet 13b. The first facet 13a, the second facet 13b, and the third facet 13j are arranged in that order in the direction of the first axis Ax1. The laser structure 13 includes an embedding body 31 and the substrate 33. The third facet 13j terminates the semiconductor mesa 23, the embedding body 31, and the substrate 33. The quantum cascade laser emits light from the third facet 13j.

The insulating film 15 covers the semiconductor surface in the recess 27, specifically, the mesa facet 23a of the semiconductor mesa 23 and a facet 31a and proximal facets 31b of the embedding body 31.

FIGS. 1B to 1D show plan views of the various first regions 13c which the quantum cascade laser 11 according to the embodiment may have. FIGS. 2B to 2D are sectional views taken along line II-II in FIG. 1A, and each corresponding to FIGS. 1B to 1D. As shown in FIG. 1B, the first facet 13a and the second facet 13b extend from one side surface 13h to the other side surface 13i of the quantum cascade laser 11. The second facet 13b terminates the semiconductor mesa 23 and the embedding body 31. The substrate 33 terminates at the first facet 13a. The second facet 13b includes the mesa facet 23a of the semiconductor mesa 23 and the facet 31a of the embedding body 31. The insulating film 15 is in contact with the mesa facet 23a of the semiconductor mesa 23 and the facet 31a of the embedding body 31.

As shown in FIGS. 1C and 1D, the embedding body 31 has proximal facets 31b adjacent to both sides of the mesa facet 23a of the semiconductor mesa 23 and distal facets 31c located outside on both sides of the proximal facets 31b. The proximal facets 31b and the distal facets 31c terminate the embedding body 31. The insulating film 15 covers the semiconductor surface in the recess 27, specifically, the mesa facet 23a of the semiconductor mesa 23 and the proximal facets 31b of the embedding body 31.

As shown in FIG. 1C, the distal facets 31c of the embedding body 31 are adjacent to both sides of the mesa facet 23a of the semiconductor mesa 23. The second facet 13b includes the mesa facet 23a of the semiconductor mesa 23 and the proximal facets 31b and distal facets 31c of the embedding body 31. The insulating film 15 is in contact with the mesa facet 23a of the semiconductor mesa 23 and the proximal facets 31b of the embedding body 31. The metal film 19 covers the distal facets 31c and the upper surface and side edges of the insulating film 15. In this example, the metal film 19 is in contact with the insulating film 15 and the distal facets 31c of the embedding body 31, and the insulating film 15 is disposed between the mesa facet 23a and the metal film 19.

As shown in FIG. 1D, the distal facets 31c of the embedding body 31 are separated from the proximal facets 31b of the embedding body 31 in the direction of the first axis Ax1. The second facet 13b includes the mesa facet 23a of the semiconductor mesa 23 and the proximal facets 31b of the embedding body 31, whereas the first facet 13a includes the distal facets 31c. The insulating film 15 is in contact with the mesa facet 23a of the semiconductor mesa 23 and the proximal facets 31b of the embedding body 31. The metal film 19 is in contact with the insulating film 15 and is separated from the semiconductor of the laser structure 13.

As shown in FIG. 2A, the quantum cascade laser 11 further includes a second electrode 21. The second electrode 21 is disposed on the back surface 13f of the substrate 33 of the laser structure 13.

The second facet 13b has a reflective surface height HREF defined by the distance from the connecting surface 25 to the epitaxial surface 13e. This reflective surface height HREF is, for example, 5 to 10 μm. The semiconductor mesa 23 has a height HMES defined by the distance from the bottom 23g of the semiconductor mesa 23 to the epitaxial surface 13e. This height HMES is, for example, 5 to 10 μm. In this example, the distance H1S between the connecting surface 25 and the back surface 13f of the substrate 33 is smaller than or equal to the distance H2S between the bottom 23g of the semiconductor mesa 23 and the back surface 13f of the substrate 33.

As shown in FIGS. 2B, 2C, and 2D, the first facet 13a connects the back surface 13f of the substrate 33 to the connecting surface 25. The insulating film 15 and the metal film 19 are disposed over the connecting surface 25. The insulating film 15 is in contact with the connecting surface 25. The insulating film 15 insulates the metal film 19 over the connecting surface 25 and the second facet 13b from the semiconductor. In addition, the first electrode 17 and the metal film 19 are disposed over the epitaxial surface 13e and are isolated from each other over the insulating film 15.

The second facet 13b is provided with a bottom 13g located within the substrate 33. In this example, the bottom 13g is deeper than the bottom 23g of the semiconductor mesa 23 with respect to a main surface 33a of the substrate 33. This deep second facet 13b can reflect light spreading over both the semiconductor mesa 23 and the substrate 33 and propagating through the semiconductor mesa 23 and the substrate 33 to reach the second facet 13b.

In addition to the core layer 24a, the semiconductor mesa 23 includes an upper cladding layer 24b, a lower cladding region 24c, and a grating layer 24d. If necessary, the semiconductor mesa 23 may include a contact layer 24e. The lower cladding region 24c may include the upper portion of the substrate 33. If necessary, in addition to the upper portion of the substrate 33, the lower cladding region 24c may include a lower cladding layer 24f The lower cladding layer 24f may be formed of, for example, the same material as the upper cladding layer 24b.

As shown in FIG. 2B, the insulating film 15 may reach the upper end of the first facet 13a, and the metal film 19 may reach the upper end of the first facet 13a.

As shown in FIG. 2C, the insulating film 15 reaches the upper end of the first facet 13a. The quantum cascade laser 11 allows the insulating film 15 to cover the connecting surface 25. The metal film 19 is disposed over the connecting surface 25 and, in this example, is separated from the upper end of the first facet 13a. In the quantum cascade laser 11, the metal film 19 is not directly subjected to force applied to the product during the production of the semiconductor chip of the quantum cascade laser 11.

As shown in FIG. 2D, the insulating film 15 and the metal film 19 are separated from the upper end of the first facet 13a. In the quantum cascade laser 11, the insulating film 15 and the metal film 19 are not directly subjected to force applied to the product during the production of the semiconductor chip of the quantum cascade laser 11.

FIGS. 3A, 3B, 3C, and 3D are sectional views taken along lines IIIa-IIIa, IIIc-IIIc, and IIId-IIId, respectively, in FIG. 1A.

FIGS. 4A, 4B, 4C, and 4D are sectional views taken along lines IVa-IVa, IVb-IVb, IVc-IVc, and IVd-IVd, respectively, in FIGS. 1B to 1D.

As shown in FIGS. 3A, 3B, 3C, and 3D and FIGS. 4A, 4C, and 4D, the embedding body 31 and the substrate 33 are arranged in the direction of a second axis Ax2 crossing the first axis Ax1. The substrate 33 has the embedding body 31 disposed thereon. The embedding body 31 has, in the second region 13d, a current-blocking portion 35 having the semiconductor mesa 23 embedded therein. In the quantum cascade laser 11, the current-blocking portion 35 is provided in the embedding body 31 so that the current-blocking portion 35 can confine a current within the semiconductor mesa 23 and also facilitates heat dissipation from the semiconductor mesa 23 in the second region 13d.

The substrate 33 includes the back surface 13f of the substrate 33. In this example, the substrate 33 has, for example, a lower refractive index than the core layer 24a. The semiconductor mesa 23 has the bottom 23g thereof within the substrate 33. The high semiconductor mesa 23 is provided in the laser structure 13.

Figure 4A:
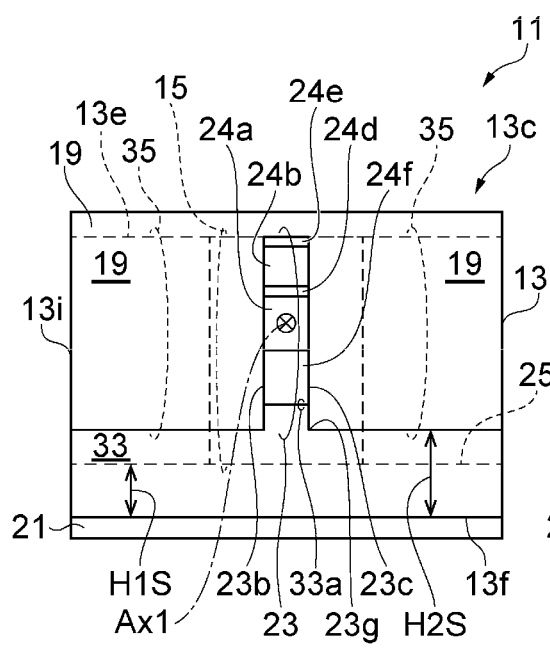
FIG. 4A is a sectional view taken along line IVa-IVa in FIG. 1B.
Figure 4B:
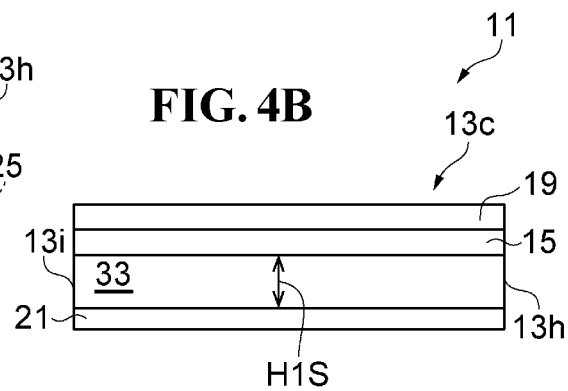
FIG. 4B is a sectional view taken along line IVb-IVb in FIGS. 1B and 1C.
Figure 4C:
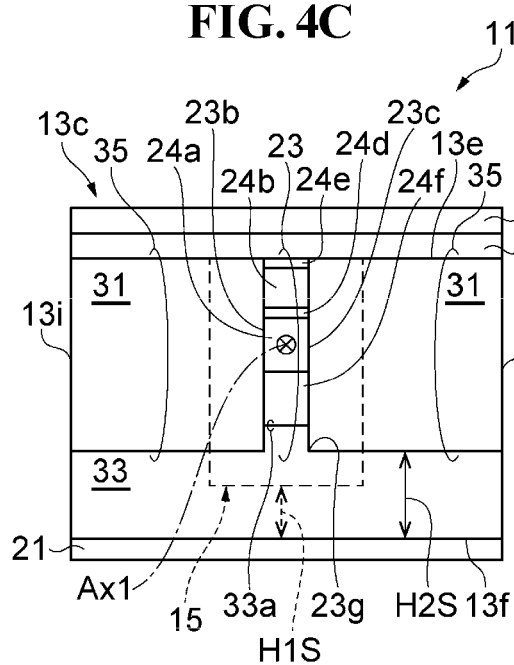
FIG. 4C is a sectional view taken along line IVc-IVc in FIG. 1D.
Figure 4D:
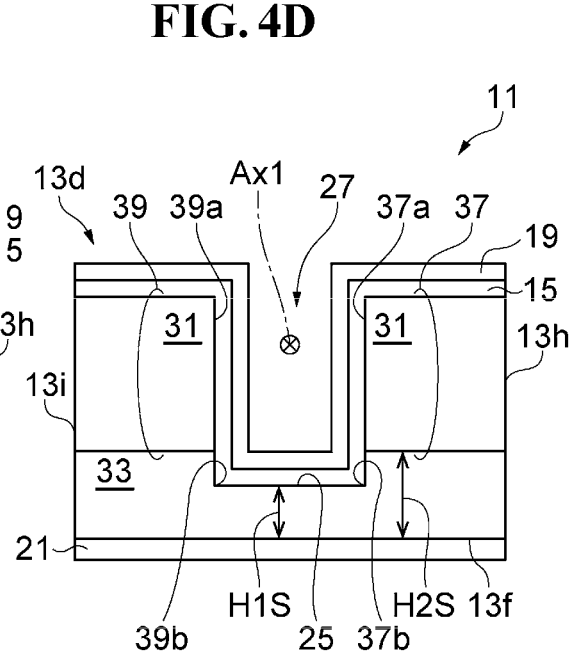
FIG. 4D is a sectional view taken along line IVd-IVd in FIG. 1D.

Referring to FIG. 4D, the substrate 33 has a first thickness H1S under the recess 27 in the first region 13c and a second thickness H2S under the semiconductor mesa 23 in the second region 13d. The first thickness H1S is smaller than the second thickness H2S. This small thickness facilitates heat dissipation through the substrate 33 in the first region 13c.

Figure 3A:
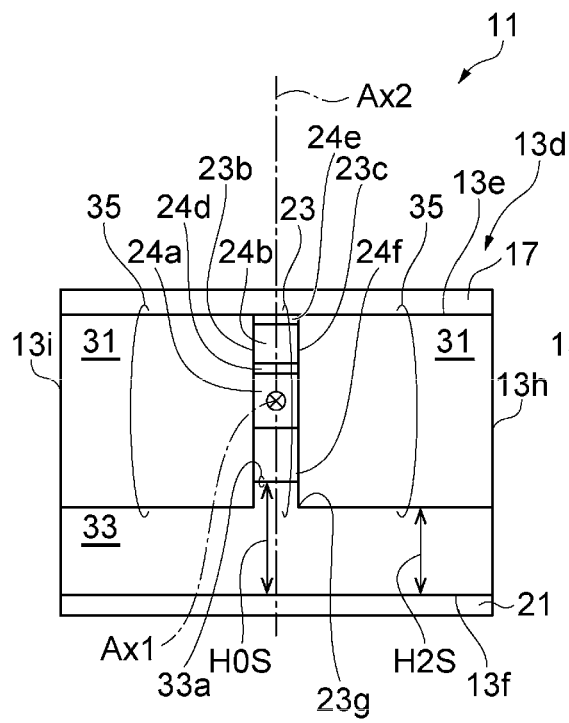
FIG. 3A is a sectional view taken along line IIIa-IIIa in FIG. 1A.

Referring to FIGS. 2A and 3A, at a position away from the second facet 13b, the first electrode 17 is in contact with the upper surface of the semiconductor mesa 23 and the upper surface of the embedding body 31 of the laser structure 13 through the contact opening 15a in the insulating film 15.

Figure 3B:
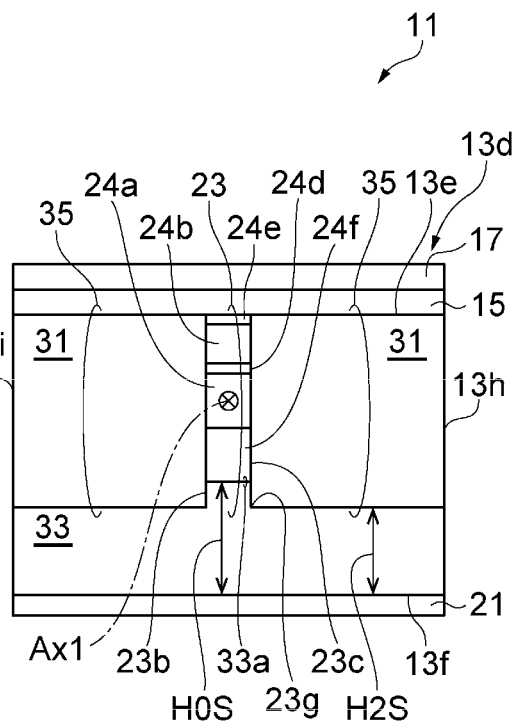
FIG. 3B is a sectional view taken along line IIIb-IIIb in FIG. 1A.

Referring to FIGS. 2A and 3B, the opening 15a in the insulating film 15 terminates, and the insulating film 15 is in contact with the epitaxial surface 13e of the laser structure 13, specifically, the upper surface of the semiconductor mesa 23 and the upper surface of the embedding body 31. The insulating film 15 extends from the side surface 13h to the other side surface 13i of the laser structure 13 and is in contact with the upper surfaces of the semiconductor mesa 23 and the embedding body 31. The first electrode 17 is in contact with the upper surface of the insulating film 15.

Figure 3C:
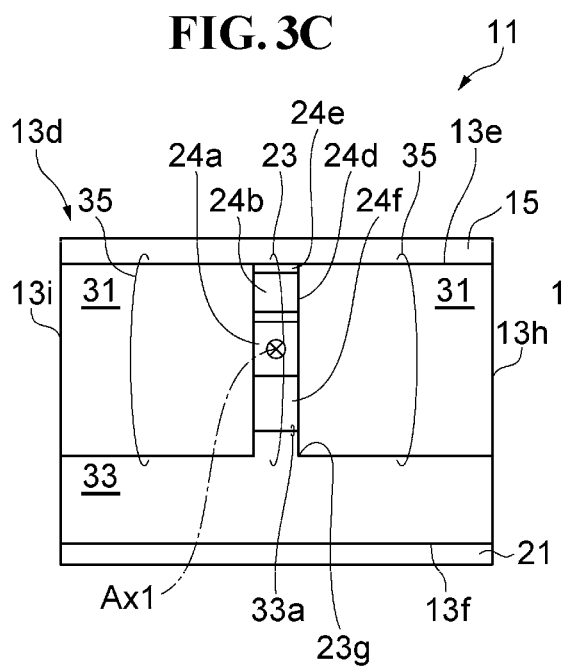
FIG. 3C is a sectional view taken along line IIIc-IIIc in FIG. 1A.

Referring to FIGS. 2A and 3C, the first electrode 17 terminates, and the insulating film 15 extends from the side surface 13h to the other side surface 13i of the laser structure 13 over the upper surfaces of the semiconductor mesa 23 and the embedding body 31.

Figure 3D:
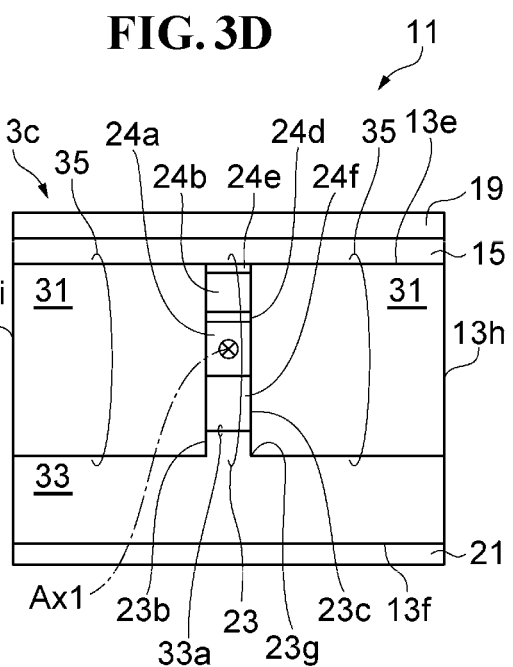
FIG. 3D is a sectional view taken along line IIId-IIId in FIG. 1A.

Referring to FIGS. 2A and 3D, the insulating film 15 on the epitaxial surface 13e preferably extends over the second facet 13b via the upper edge of the second facet 13b and also extends from the side surface 13h to the other side surface 13i of the laser structure 13. The metal film 19 extends over the second facet 13b to reach the upper edge of the second facet 13b and then extends over the epitaxial surface 13e of the laser structure 13. The metal film 19 terminates on the insulating film 15.

The metal film 19 and the first electrode 17 terminate on the insulating film 15 so as to be isolated from each other on the insulating film 15. The metal film 19 is separated from the first electrode 17 by a distance of 10 to 100 μm.

Epitaxial Structure 1

As shown in FIGS. 1B and 1C and FIGS. 4A and 4B, the connecting surface 25 in the first region 13c may extend from the side surface 13h to the other side surface 13i of the laser structure 13. The quantum cascade laser 11 allows the second facet 13b to extend from the side surface 13h to the other side surface 13i of the laser structure 13. The mesa facet 23a of the semiconductor mesa 23 and its surrounding area can be provided in the second facet 13b.

As shown in FIGS. 1B and 1C, the mesa facet 23a of the semiconductor mesa 23 and its surrounding area are covered by the insulating film 15 and the metal film 19. The insulating film 15 and the metal film 19 are also disposed over the connecting surface 25. The metal film 19 can provide a heat propagation path from the mesa facet 23a of the semiconductor mesa 23 through the connecting surface 25 to the substrate 33. In this example, the insulating film 15 and the metal film 19 extend from the side surface 13h to the other side surface 13i of the laser structure 13 over the connecting surface 25.

Specifically, as shown in FIG. 1B, the insulating film 15 and the metal film 19 may extend from the side surface 13h to the other side surface 13i of the laser structure 13. The insulating film 15 is disposed on the second facet 13b between the mesa facet 23a and the metal film 19 and between the embedding body 31 and the metal film 19. In this example, the insulating film 15 is in contact with the mesa facet 23a and the embedding body 31 in the second facet 13b.

Specifically, as shown in FIG. 1C, the insulating film 15 may be in contact with a portion of the second facet 13b, specifically, the entire mesa facet 23a and the nearby portions of the embedding body 31 in the second facet 13b, whereas the metal film 19 may be in contact with the insulating film 15 on the mesa facet 23a and the embedding body 31 in the second facet 13b. The insulating film 15 is wider than the mesa facet 23a. In this example, the metal film 19 is wider than the insulating film 15. In this example, the metal film 19 extends from the side surface 13h to the other side surface 13i of the laser structure 13.

Epitaxial Structure 2

As shown in FIGS. 1D and 4D, the laser structure 13 has a first extending portion 37 and a second extending portion 39 in the first region 13c. The first extending portion 37 and the second extending portion 39 extend from the current-blocking portion 35 of the embedding body 31. The first extending portion 37 and the second extending portion 39 can provide a heat propagation path from one side surface 23b and the other side surface 23c of the semiconductor mesa 23 through the current-blocking portion 35 to the substrate 33.

The first extending portion 37, the recess 27, and the second extending portion 39 are arranged in the direction of a third axis Ax3 crossing the first axis Ax1 and the second axis Ax2. The second facet 13b terminates at the bases of the first extending portion 37 and the second extending portion 39 and does not reach the side surface 13h or the other side surface 13i of the laser structure 13. The distance between the first extending portion 37 and the second extending portion 39 is larger than the distance between the side surface 23b and the other side surface 23c of the semiconductor mesa 23 (referred to as "mesa width"). To reflect light guided through the semiconductor mesa 23 at the second facet 13b with high reflectivity, the distance between the first extending portion 37 and the second extending portion 39 may be twice or more the mesa width of the semiconductor mesa 23.

As shown in FIG. 4D, in this example, the insulating film 15 and the metal film 19 may be disposed over the first extending portion 37 and the second extending portion 39. The metal film 19 over the first extending portion 37 and the second extending portion 39 contributes to heat dissipation from the mesa facet 23a of the semiconductor mesa 23.

Preferably, the first extending portion 37 and the second extending portion 39 extend from the current-blocking portion 35, and the insulating film 15 and the metal film 19 are continuously disposed over the second facet 13b, the connecting surface 25, the first extending portion 37, and the second extending portion 39.

The insulating film 15 and the metal film 19 are disposed over the connecting surface 25, a first side surface 37a, and a second side surface 39a.

As shown in FIG. 4D, the first extending portion 37 and the second extending portion 39 have the first side surface 37a and the second side surface 39a, respectively. The first side surface 37a and the second side surface 39a extend in the direction of the first axis Ax1. The connecting surface 25 connects the first side surface 37a to the second side surface 39a. The first side surface 37a and the second side surface 39a connect the first facet 13a to the second facet 13b. The second facet 13b connects the first side surface 37a to the second side surface 39a. The second facet 13b, the first side surface 37a, the second side surface 39a, and the connecting surface 25 define the recess 27. The first side surface 37a and the second side surface 39a have a first bottom 37b and a second bottom 39b, respectively, located within the substrate 33.

In the quantum cascade laser 11, the connecting surface 25, the first side surface 37a, and the second side surface 39a connect the first facet 13a to the second facet 13b and separate the first facet 13a from the second facet 13b. The metal film 19 can provide a heat propagation path from the mesa facet 23a of the semiconductor mesa 23 through the connecting surface 25 to the substrate 33.

The quantum cascade lasers shown in FIGS. 2B, 2C, and 2D may include any of the epitaxial structures shown in FIGS. 1B, 1C, and 1D.

Figure 5A:
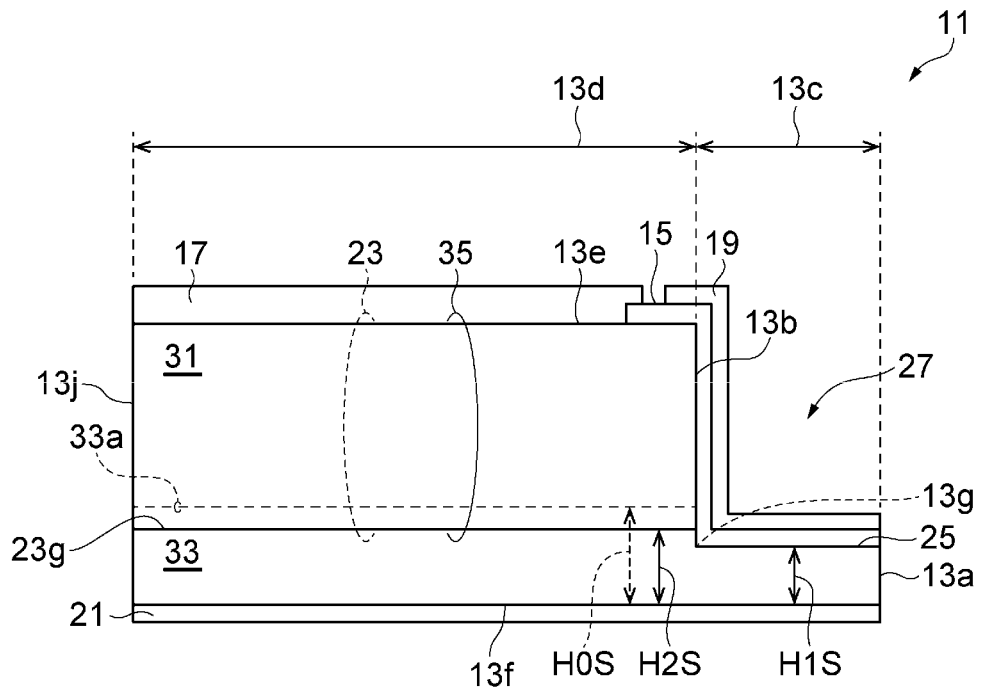
FIG. 5A is a sectional view taken along line Va-Va in FIGS. 1A to 1C.

FIG. 5A is a sectional view taken along line Va-Va in FIGS. 1A to 1C. The connecting surface 25 forms the recess 27, which is deeper than the bottom 23g of the semiconductor mesa 23. The second facet 13b also has the lower end 13g thereof at a position deeper than the bottom 23g of the semiconductor mesa 23. The metal film 19 is disposed over the second facet 13b and reflects laser light propagating through the semiconductor mesa 23 and the substrate 33.

Figure 5B:
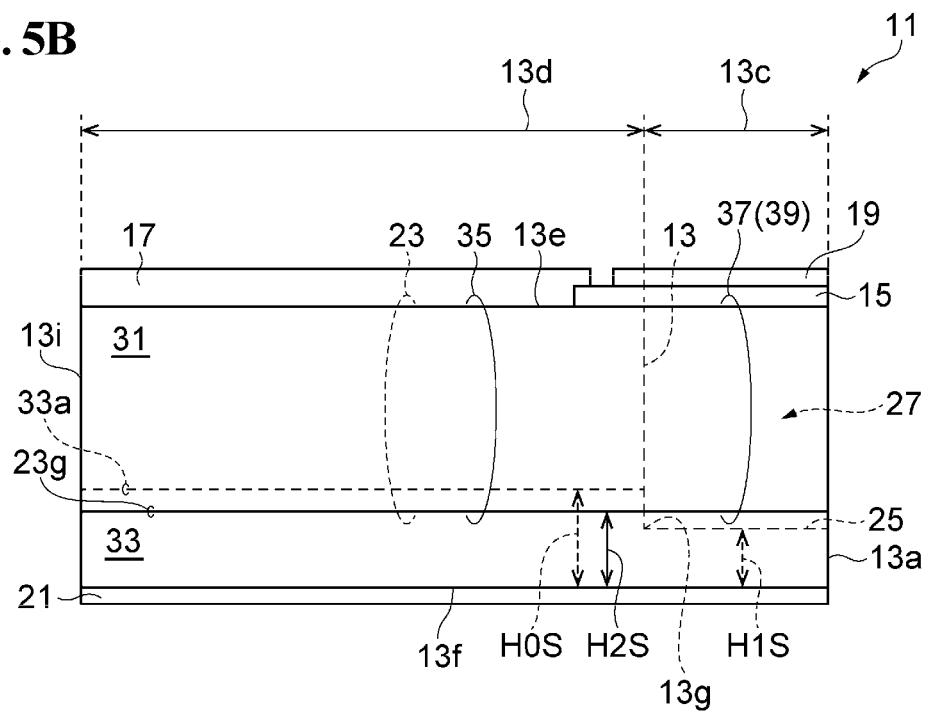
FIG. 5B is a sectional view taken along line Vb-Vb in FIGS. 1A and 1D.

FIG. 5B is a sectional view taken along line Vb-Vb in FIGS. 1A and 1D. The connecting surface 25 extends from the first facet 13a to the second facet 13b between the first extending portion 37 and the second extending portion 39. The connecting surface 25 forms the recess 27, which is deeper than the bottom 23g of the semiconductor mesa 23. The second facet 13b also has the lower end (13g) thereof at a position deeper than the bottom 23g of the semiconductor mesa 23. The metal film 19 is disposed over the second facet 13b and reflects laser light propagating through the semiconductor mesa 23 and the substrate 33.

The quantum cascade lasers shown in FIGS. 5A and 5B may include any of the structures of the insulating film 15 and the metal film 19 shown in FIGS. 2B, 2C, and 2D and FIGS. 1B, 1C, and 1D.

As shown in FIGS. 2A to 2D, 4D, and 5A, the insulating film 15 covers the second facet 13b, including the mesa facet 23a and the proximal facets 31b, the connecting surface 25, the first side surface 37a of the first extending portion 37, and the second side surface 39a of the second extending portion 39, or covers the second facet 13b and the connecting surface 25. The connecting surface 25 meets the mesa facet 23a and other semiconductor surfaces, such as the proximal facets 31b, the first side surface 37a, and the second side surface 39a, to form their respective ridge lines. The connecting surface 25 makes a right or nearly right angle with another semiconductor surface at each ridge line. The insulating film 15 may be thinner or lower in quality than desired near a ridge line with such an angle. The insulating film 15 is also covered by the metal film 19 near the ridge lines.

In the quantum cascade laser 11, a voltage of about 10 to 20 V is applied between the first electrode 17 and the second electrode 21. The metal film 19 is separated from the first electrode 17 and the second electrode 21 and is therefore not subjected to the voltage applied to the quantum cascade laser 11.

Figure 6:
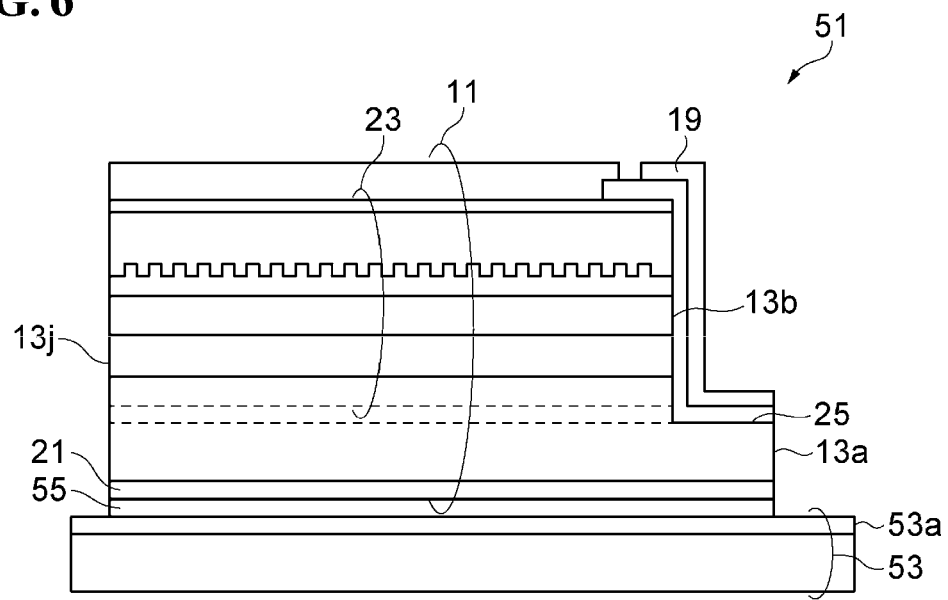
FIG. 6 is a schematic view of a quantum cascade laser device according to this embodiment.

FIG. 6 is a schematic view of a quantum cascade laser device according to this embodiment. A quantum cascade laser device 51 includes the quantum cascade laser 11 according to this embodiment, a submount 53, and a solder 55. The quantum cascade laser 11 is fixed to the submount 53 with the solder 55. The solder 55 bonds the second electrode 21 of the quantum cascade laser 11 to a conductive layer 53a of the submount 53. The solder 55 is isolated from the metal film 19 over the second facet 13b and the connecting surface 25. Because of this isolation, the metal film 19 is not electrically connected to the solder 55.

The insulating film 15 may include at least one of $SiO_2$, SiON, SiN, alumina, benzocyclobutene (BCB), and polyimide. These dielectric films can be used as the insulating film 15. These dielectric films can provide superior durability and insulation properties. These dielectric films can be easily formed by deposition processes such as sputtering, CVD, and spin coating. The insulating film 15 may have a thickness of 10 to 50 nm on the epitaxial surface 13e. The insulating film 15 has a large width in the lateral direction, for example, with a margin of 5 μM or more from each side surface of the semiconductor mesa 23 in the mesa facet 23a. If possible, the insulating film 15 preferably reaches the side surface 13h and the other side surface 13i of the quantum cascade laser 11. The semiconductor mesa 23 may have a width in the Ax3 axis direction of, for example, 3 to 10 μm.

The metal film 19 may include, for example, Au, Pt, or Ti. Au can be used for the metal film 19. A Au film can be formed, for example, by evaporation. To achieve the desired reflectivity in the oscillation wavelength range of the quantum cascade laser 11 (e.g., 3 to 20 μm), the metal film 19 over the second facet 13b may have a thickness of, for example, 20 to 200 nm.

EXAMPLES

An example of the quantum cascade laser 11 will now be described. The substrate 33 is conductive and may include, for example, an n-type InP substrate. Semiconductor materials for the semiconductor layers of quantum cascade lasers that emit mid-infrared laser light have lattice constants close to that of InP. Semiconductor substrates are used for crystal growth by growth processes such as molecular beam epitaxy and metal organic chemical vapor deposition.

The upper cladding layer 24b and the lower cladding layer 24f may include n-InP, which can transmit mid-infrared light.

The core layer 24a is a stack of unit structures including an active layer and an injection layer. Specifically, the core layer 24a includes active layers and injection layers that are alternately connected in multiple stages. The active layers and the injection layers each include a superlattice structure. The superlattice structure includes a plurality of quantum well layers and a plurality of barrier layers that are alternately stacked on top of each other. A quantum cascade laser performs laser oscillation by amplifying, through a resonator, mid-infrared light emitted by intersubband transition of one type of carrier, for example, electrons, from an upper subband level to a lower subband level of the conduction band within the active layers. The quantum well layers may include, for example, GaInAs or GaInAsP, whereas the barrier layers may include AlInAs. The superlattice structure of an active layer in which the quantum well layers and the barrier layers include these materials can provide an energy difference, between the upper and lower subband levels of the conduction band, that provides transition at mid-infrared wavelengths, for example, 3 to 20 μm.

The contact layer 24e is used if necessary. The contact layer 24e includes a material that has a bandgap low enough to provide a good ohmic contact with the first electrode 17 and that can be lattice-matched to an InP substrate. For example, the contact layer 24e may include n-GaInAs.

The grating layer 24d provides a distributed feedback structure for the quantum cascade laser 11. The grating layer 24d has a grating structure formed by etching. The grating structure can provide single-mode oscillation at the Bragg wavelength corresponding to the period P shown in FIG. 2A. The grating layer 24d may include a high-refractive-index semiconductor that can provide a large coupling coefficient, for example, unintentionally doped or n-type GaInAs.

The embedding body 31 provides an embedded heterostructure for the quantum cascade laser 11. The embedding body 31 functions as a current-blocking layer including a high-resistivity unintentionally doped or semi-insulating semiconductor and confines carriers within the semiconductor mesa 23. The semi-insulating semiconductor is a III-V compound semiconductor doped with a transition metal such as Fe, Ti, Cr, or Co. In particular, Fe is a preferred dopant.

The first electrode 17 and the second electrode 21 may include, for example, Ti/Au, Ti/Pt/Au, or Ge/Au.

If necessary, an optical confinement region may be provided above, below, or both above and below the core layer 24a to enhance the confinement of guided light within the core layer 24a. The optical confinement region may include a high-refractive-index semiconductor that can be lattice-matched to InP, for example, unintentionally doped or n-type GaInAs.

A semiconductor with n-type conductivity can be achieved by the addition of an n-type dopant such as Si, S, Sn, or Se.

FIGS. 7A to 10B show the main steps of a method for producing the quantum cascade laser 11 according to this embodiment. In FIGS. 7A to 10B, a coordinate system S is depicted. The coordinate system S shows the orientation of the product in each step.

Figure 7A:
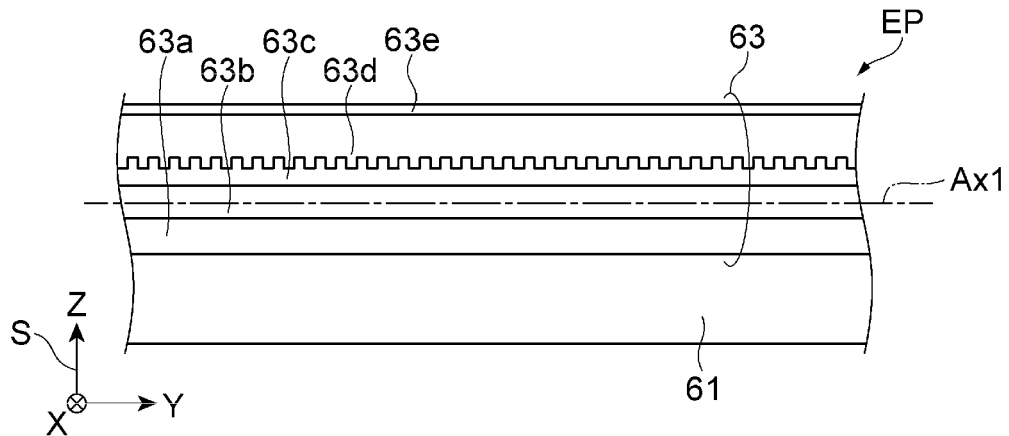
FIG. 7A shows one of the main steps of a method for producing the quantum cascade laser according to this embodiment.

In step S101, as shown in FIG. 7A, an epitaxial wafer EP is provided. The epitaxial wafer EP is produced as follows. A semiconductor wafer 61 is provided. A stack 63 is grown on the semiconductor wafer 61 by metal organic chemical vapor deposition or molecular beam epitaxy. Specifically, semiconductor films 63a, 63b, and 63c for the lower cladding layer 24f, the core layer 24a, and the grating layer 24d are grown on the semiconductor wafer 61, and a periodic structure for a grating is formed on the surface of the semiconductor film 63c for the grating layer 24d by photolithography and etching. The remaining semiconductor films (63d and 63e) for the upper cladding layer 24b and the contact layer 24e are grown on the semiconductor film 63c to form the stack 63. The stack 63 includes the semiconductor films for the quantum cascade laser, specifically, the semiconductor films (63a, 63b, 63c, 63d, and 63e) for the lower cladding layer 24f, the core layer 24a, the grating layer 24d, the upper cladding layer 24b, and the contact layer 24e.

Figure 7B:
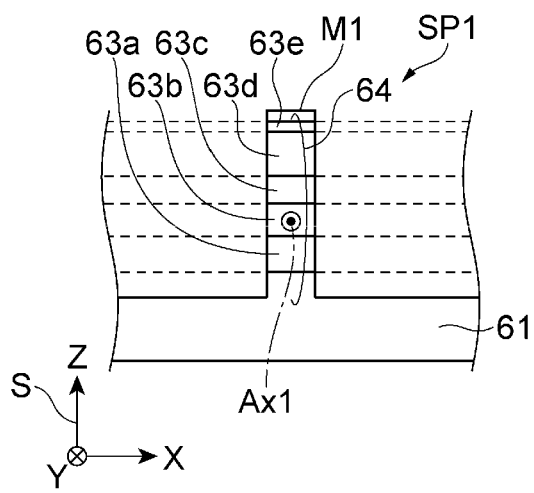
FIG. 7B shows one of the main steps of the method for producing the quantum cascade laser according to this embodiment.

An example epitaxial wafer EP is as follows:
Semiconductor wafer 61: n-type InP substrate
Stack 63
Semiconductor film 63a (lower cladding layer 24f): n-type InP
Semiconductor film 63b (core layer 24a): for example, superlattice structure composed of GaInAs/AlInAs or GaInAsP/AlInAs
Semiconductor film 63c (grating layer 24d): n-type InGaAs
Semiconductor film 63d (upper cladding layer 24b): n-type InP Semiconductor film 63e (the contact layer 24e): n-type InGaAs In step S102, as shown in FIG. 7B, a first mask M1 is formed on the epitaxial wafer EP. The first mask M1 has a pattern that defines the semiconductor mesa 23 of the quantum cascade laser 11. The first mask M1 may include a dielectric insulating film such as a silicon oxide or silicon nitride film. The epitaxial wafer EP is etched using the first mask M1 to from a first product SP1 including one or more semiconductor stripes 64. The semiconductor stripes 64 have the bottoms thereof within the semiconductor wafer 61 and extend in the direction of the first axis Ax1.

Figure 7C:
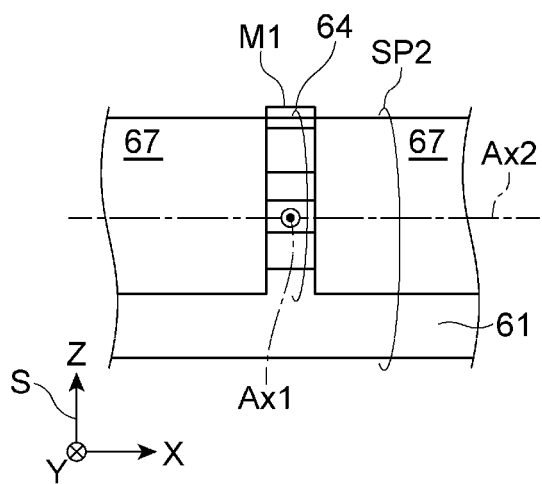
FIG. 7C shows one of the main steps of the method for producing the quantum cascade laser according to this embodiment.

In step S103, as shown in FIG. 7C, an embedding region 67 is selectively grown on the first product SP1 using the first mask M1 such that the semiconductor stripes 64 are embedded in the embedding region 67. After the embedding region 67 is formed, the first mask M1 is removed to obtain a second product SP2 including the semiconductor stripes 64 and the embedding region 67. The semiconductor stripes 64 and the embedding region 67 are alternately arranged on the semiconductor wafer 61 in the direction of the third axis Ax3. The embedding region 67 is disposed between the semiconductor stripes 64 so that both side surfaces of each semiconductor stripe 64 are embedded in the embedding region 67.

Figure 8A:
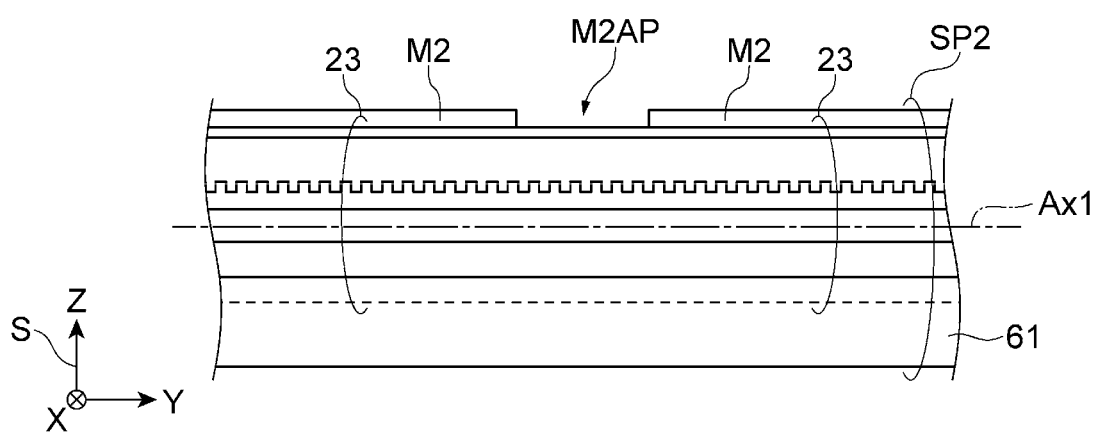
FIG. 8A shows one of the main steps of the method for producing the quantum cascade laser according to this embodiment.

In step S104, as shown in FIG. 8A, after the first mask M1 is removed, a second mask M2 is formed on the second product SP2. The second mask M2 has a pattern having stripe openings M2AP that define the recess 27 of the quantum cascade laser 11. The second mask M2 extends along the semiconductor stripes 64 and defines a plurality of stripe openings M2AP arranged in the direction of the third axis Ax3. The stripe openings M2AP may be provided for the individual semiconductor stripes 64. If necessary, two adjacent stripe openings M2AP may be joined together so as to extend in the direction of the third axis Ax3. In this example, the stripe openings M2AP have a stripe shape extending in the direction of the third axis Ax3. The second mask M2 may include a dielectric insulating film such as a silicon oxide or silicon nitride film.

Figure 8B:
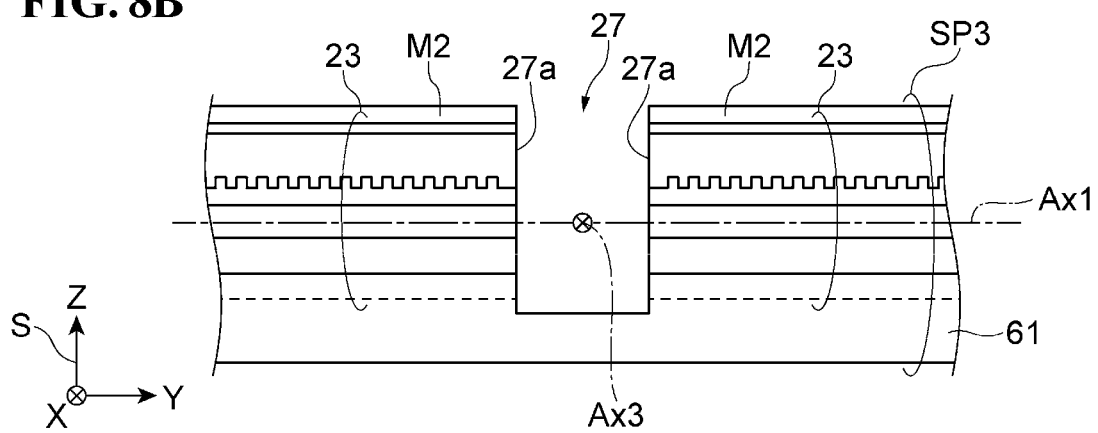
FIG. 8B shows one of the main steps of the method for producing the quantum cascade laser according to this embodiment.

The second product SP2 is etched using the second mask M2 to form a third product SP3 shown in FIG. 8B. By this etching, semiconductor mesas 23 are formed from the semiconductor stripes 64, and embedding bodies 31 are formed from the embedding region 67. In addition, a recess 27 (particularly, with a length that is twice that of the recess 27 of the quantum cascade laser 11) is formed. The recess 27 provides, for the third product SP3, etched facets 27a for the second facet 13b.

The recess 27 has the bottom thereof within the semiconductor wafer 61. This bottom is deeper than the bottoms of the semiconductor mesas 23. In this example, the recess 27 extends beyond the device segments in the direction of the third axis Ax3.

Figure 9A:
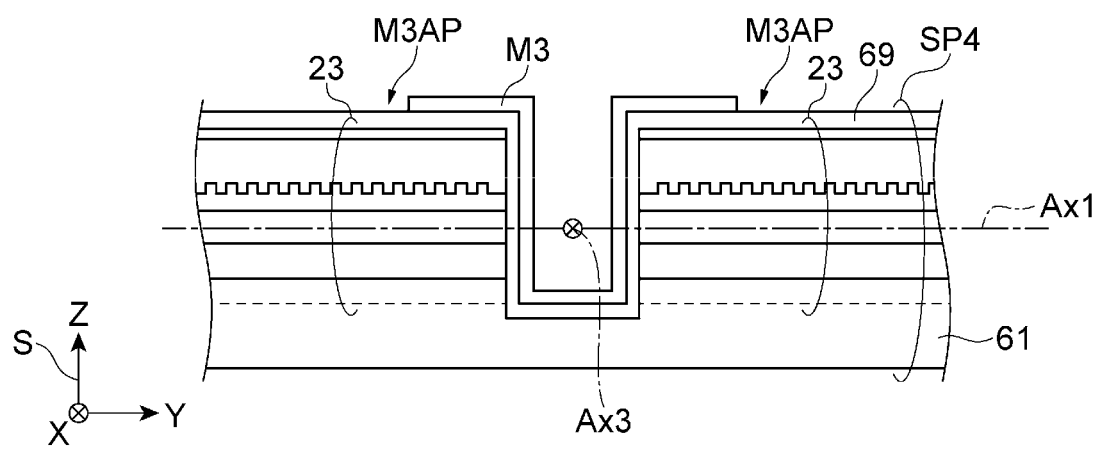
FIG. 9A shows one of the main steps of the method for producing the quantum cascade laser according to this embodiment.

In step S105, as shown in FIG. 9A, after the second mask M2 is removed, an insulating film 69 is deposited on the third product SP3. The insulating film 69 may include a dielectric insulating film such as a silicon oxide or silicon nitride film. The insulating film 69 is in contact with the side surfaces (second facet 13b) and bottom surface (connecting surface 25) of the recess 27, the semiconductor mesas 23, and the embedding bodies 31 of the third product SP3.

In step S106, as shown in FIG. 9A, a third mask M3 made of a resist is formed on the insulating film 69 to obtain a fourth product SP4. The third mask M3 has a pattern that defines contact openings for the first electrode 17. In this example, this pattern extends across the device segments in the direction of the third axis Ax3 and defines openings M3AP located above the semiconductor mesas 23 and the embedding bodies 31.

Figure 9B:
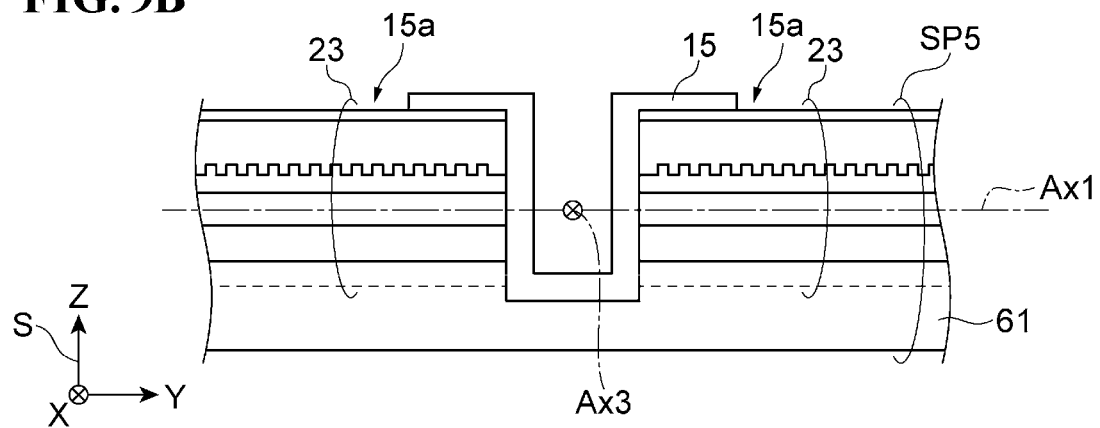
FIG. 9B shows one of the main steps of the method for producing the quantum cascade laser according to this embodiment.

In step S107, as shown in FIG. 9B, the insulating film 69 is etched using the third mask M3 to form an insulating film 15, followed by removing the third mask M3 to obtain a fifth product SP5. This etching may be wet etching or dry etching. The insulating film 15 has contact openings 15a. The contact openings 15a are located above the semiconductor mesas 23 and the embedding bodies 31 and extend in the direction of the third axis Ax3.

Figure 10A:
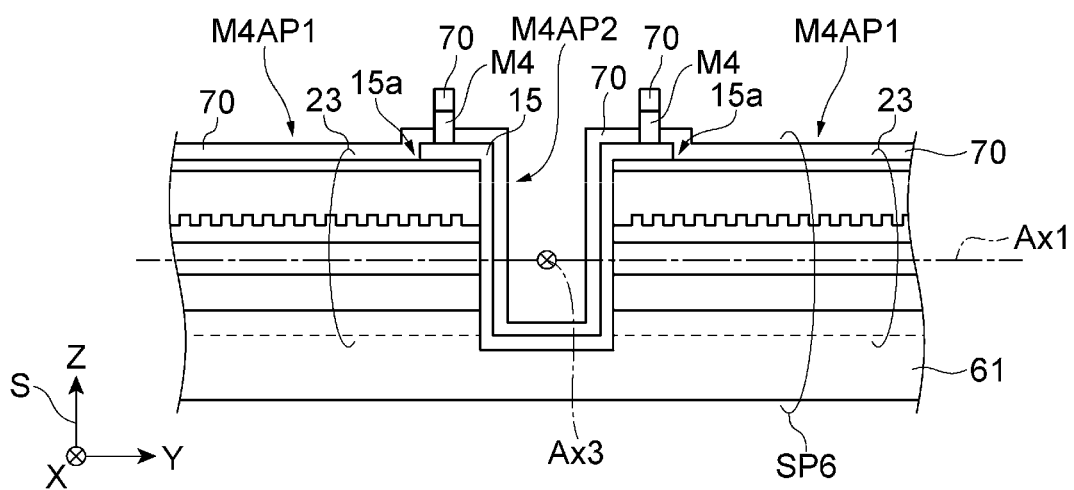
FIG. 10A shows one of the main steps of the method for producing the quantum cascade laser according to this embodiment.

In step S108, as shown in FIG. 10A, a fourth mask M4 made of a resist is formed on the fifth product SP5. The fourth mask M4 has a pattern for forming the first electrode 17 and the metal film 19 from a single metal deposited film 70 by a lift-off process. This pattern extends across the device segments on the insulating film 15 on the semiconductor mesas 23 and the embedding bodies 31 in the direction of the third axis Ax3 and reaches the area outside the array of device segments. The pattern defines first openings M4AP1 and a second opening M4AP2 that are separated from each other. The first openings M4AP1 are separated from the recess 27 and the second facets 13b and are located above the semiconductor mesas 23 and the embedding bodies 31, whereas the second opening M4AP2 is located above the entire recess 27 and second facets 13b. The single metal deposited film 70 is deposited on the semiconductor wafer surface on which the fourth mask M4 has been formed to obtain a sixth product SP6 shown in FIG. 10A.

Figure 10B:
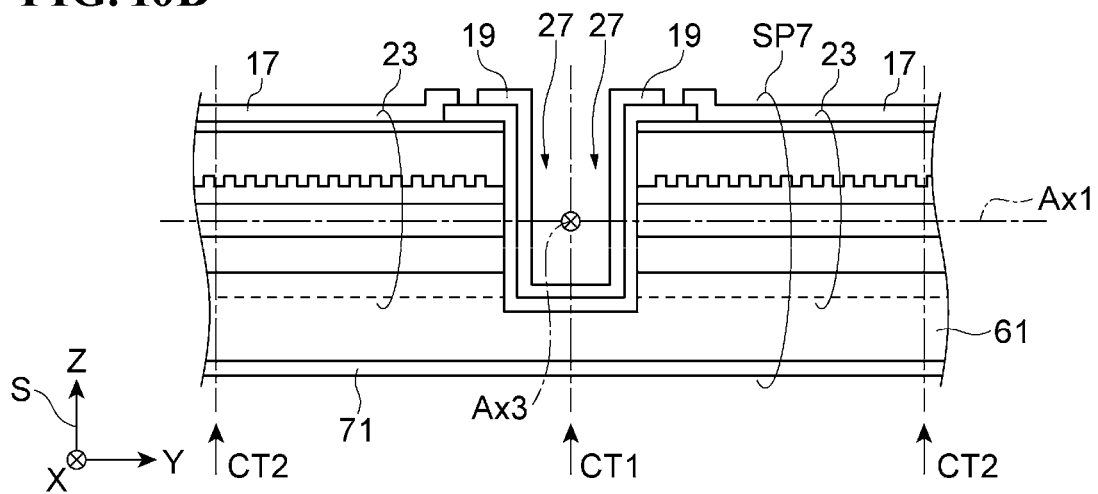
FIG. 10B shows one of the main steps of the method for producing the quantum cascade laser according to this embodiment.

In step S109, as shown in FIG. 10B, after the metal deposited film 70 is deposited, the fourth mask M4 is removed by a lift-off process to from first electrodes 17 and metal films 19. If necessary, the first electrodes 17 and the metal films 19 may be formed in another manufacturing step. Thereafter, a metal film 71 for the second electrode 21 is formed on the back surface of the semiconductor wafer 61 to obtain a seventh product SP7.

After the metal film 71 is formed, the seventh product SP7 is divided at the positions indicated by arrows CT1 and CT2 to obtain quantum cascade lasers 11. By division at arrow CT1, first facets 13a are formed. By division at arrows CT2, the third facets 13j of the quantum cascade lasers 11 are formed.

Whereas the principles of the present invention have been illustrated and described with reference to a preferred embodiment, one skilled in the art would appreciate that modifications can be made to the arrangement and other details without departing from the principles of the invention. The invention is not limited to any particular configuration disclosed in the embodiment. Thus, all changes and modifications that come within the scope and spirit of the claims are to be claimed.

What is claimed is:

1. A quantum cascade laser comprising:
a laser structure having a first region including a first facet, a second region including a second facet, an epitaxial surface, and a substrate surface;
an insulating film disposed on the second facet and the epitaxial surface of the laser structure;
an electrode disposed on the epitaxial surface of the laser structure and the insulating film and in contact with the epitaxial surface through an opening in the insulating film, the opening extending completely across a portion of the second region from a first lateral side to a second lateral side; and a metal film disposed over the second facet and the epitaxial surface of the laser structure and separated from the electrode and the substrate surface, wherein the insulating film is disposed between the metal film and the second facet and between the metal film and the epitaxial surface, the insulating film overlapping the center of the laser at the top of the second facet, the epitaxial surface is opposite the substrate surface, the first region and the second region are arranged in a direction of a first axis, the second region includes a semiconductor mesa having a core layer extending in the direction of the first axis, the second facet is located at a boundary between the first region and the second region, the second facet terminates the semiconductor mesa, the first region includes a connecting surface extending in the direction of the first axis, and the connecting surface connects the second facet to the first facet.

2. The quantum cascade laser according to claim 1, wherein the laser structure includes an embedding body and a substrate, the second facet has a bottom thereof within the substrate, the substrate has the embedding body disposed thereon, and the embedding body has, in the second region, a current-blocking portion having the semiconductor mesa embedded therein.

3. The quantum cascade laser according to claim 1, wherein the connecting surface extends from one side surface to another side surface of the laser structure, and the insulating film and the metal film are disposed over the connecting surface.

4. The quantum cascade laser according to claim 2, wherein the laser structure has, in the first region, a first extending portion and a second extending portion extending from the current-blocking portion of the embedding body, and the metal film is disposed over the first extending portion and the second extending portion.

5. The quantum cascade laser according to claim 4, wherein the first extending portion and the second extending portion have a first side surface and a second side surface, respectively, extending in the direction of the first axis, the first side surface and the second side surface are connected to the first facet, the connecting surface connects the first side surface and the second side surface to each other, the second facet connects the first side surface and the second side surface to each other, and the insulating film and the metal film are disposed over the connecting surface, the first side surface, and the second side surface.

6. The quantum cascade laser according to any one of claim 1, wherein the insulating film is disposed on the connecting surface, the insulating film is separated from an upper end of the first facet, the metal film is disposed over the connecting surface, the metal film is separated from the upper end of the first facet, and the first facet connects the substrate surface to the connecting surface.

7. The quantum cascade laser according to any one of claim 1, wherein the insulating film is disposed on the connecting surface, the insulating film reaches an upper end of the first facet, the metal film is disposed over the connecting surface, and the first facet connects the substrate surface to the connecting surface.

8. The quantum cascade laser according to claim 7, wherein the metal film does not reach the upper end of the first facet.

* * * * *